(12) United States Patent
Yoshimoto

(10) Patent No.: US 7,692,513 B2
(45) Date of Patent: Apr. 6, 2010

(54) ACOUSTIC SURFACE WAVE FILTER MODULE AND METHOD OF MANUFACTURING THE SAME

(75) Inventor: Susumu Yoshimoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 12/462,385

(22) Filed: Aug. 3, 2009

(65) Prior Publication Data
US 2009/0318108 A1    Dec. 24, 2009

Related U.S. Application Data

(63) Continuation of application No. 11/504,787, filed on Aug. 15, 2006, now abandoned.

(30) Foreign Application Priority Data
Aug. 17, 2005    (JP) .............................. 2005-236933

(51) Int. Cl.
*H03H 7/38*    (2006.01)
*H01L 41/00*    (2006.01)
*H03H 9/00*    (2006.01)

(52) U.S. Cl. .................... 333/32; 333/133; 333/193

(58) Field of Classification Search .................. 333/133, 333/32
See application file for complete search history.

(56) References Cited

U.S. PATENT DOCUMENTS

| 6,900,705 B2 * | 5/2005 | Nakamura et al. ............ 333/25 |
| 2004/0257172 A1 * | 12/2004 | Schmidhammer et al. ... 333/133 |

* cited by examiner

*Primary Examiner*—Vibol Tan
*Assistant Examiner*—Matthew C Tabler
(74) *Attorney, Agent, or Firm*—Jordan and Hamburg LLP

(57) ABSTRACT

In order to reduce the parts required for matching of an SAW filter module, the SAW filter module 10 obtains matching for coupling SAW filters 10A to 10D with RF-IC 20 using impedance matching circuits 11A to 11D. The real part of output impedance Z saw of the SAW filter is closely matched with the real part of input impedance Zic of an RF-IC. The impedance matching circuit modifies the imaginary part of the output impedance Zm of the SAW filter module according to the imaginary part of the input impedance Zic of the RF-IC 20. The impedance matching circuit composed of one piece of inductance or capacitor, or a plurality of inductors or capacitors in parallel connection, ans formed as a print pattern on a module substrate, in which the real part R saw and the real part Ric are in a relation nearly of $0.8\ Ric < R\ saw < 1.2\ Ric$.

4 Claims, 10 Drawing Sheets

Fig. 4(a) WITHOUT MATCHING

Fig. 4(b) WITH MATCHING

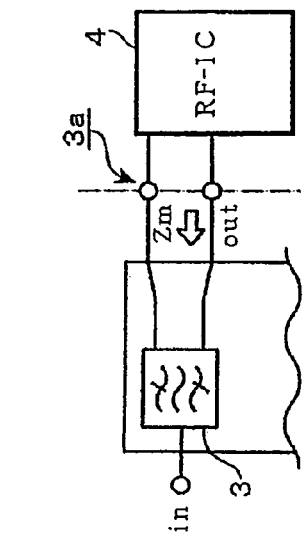
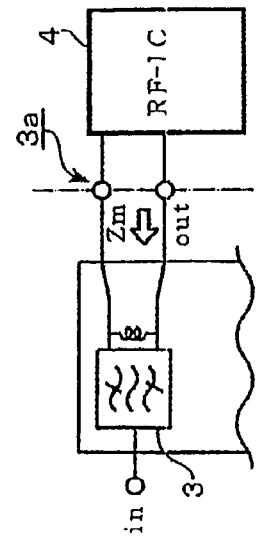
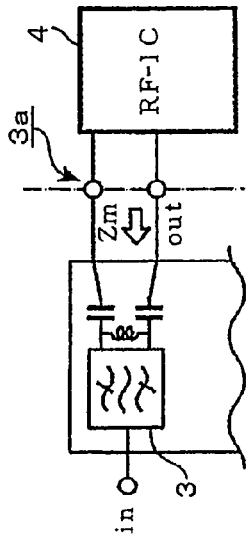
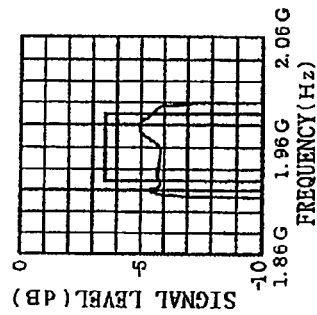
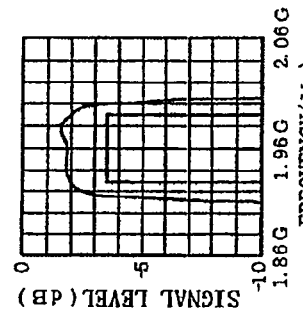
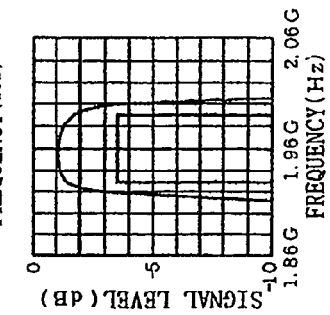
RELATED ART
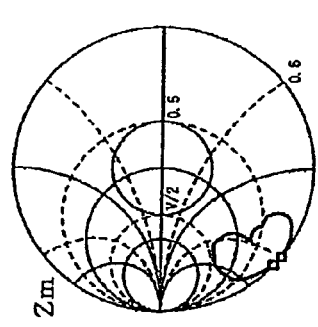
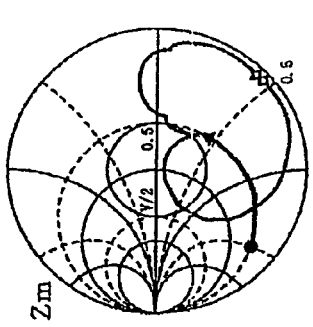
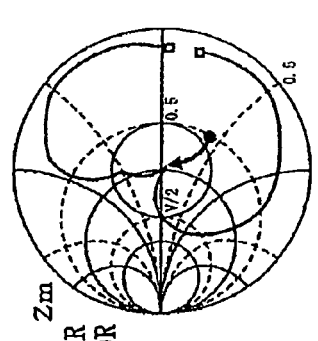
Fig. 11 (a) WITHOUT MATCHING
Fig. 11 (b) WITH INDUCTOR
Fig. 11 (c) WITH INDUCTOR AND CAPACITOR

ACOUSTIC SURFACE WAVE FILTER MODULE AND METHOD OF MANUFACTURING THE SAME

BACKGROUND OF THE INVENTION

1. Field of the Invention

The present invention relates to a surface acoustic wave (SAW) filter module mounted on a radio terminal such as a cellular phone or the like and distinguishing a high frequency signal, and in particular, relates to an impedance matching technology for matching with a transceiver IC (RF-IC).

2. Description of the Related Art

FIG. 8 shows a configuration example of a front-end unit of a quadband GSM type cellular phone. In this example, an antenna switch IC 2 is disposed directly below an antenna 1. A filter bank (4 systems) 300 embedding a plurality of receive SAW filters (hereinafter, referred to as an RxSAW filter) formed on the piezoelectric substrate is connected to an antenna switch 2 on the reception side, and a transmission side has a configuration such that a transmitting signal from a transceiver IC 4 as a high frequency transmission and reception device is inputted into an antenna switch 2 via a power amplifier 5.

Generally, in a radio terminal, an impedance matching means is provided for coupling circuit elements together so as to restrain a reflection phenomenon generated due to mismatch of impedance in a high frequency signal system (refer to Patent Document 1, for instance). In the example in FIG. 8, since the output and input impedance of a transceiver IC 4 and a receive SAW filter 3 (hereinafter, referred to as an RxSAW filter) are different, it is impossible to simply connect the RxSAW filter 3 and the transceiver IC 4 directly, and provision of an impedance matching circuit 6 configured with an inductance, a capacitor, and a resistor is required between the RxSAW filter 3 and the transceiver IC 4.

When realizing the impedance matching circuit 6 using discrete parts, much expense in terms of time and effort is needed for its adjustment, and it also requires increased man-hours for design on a portable terminal manufacturer side. In addition, a plurality of parts is generally necessary as the matching circuit parts, which raises material costs for the parts.

Then, a so-called filter bank module shown in a configuration example in FIG. 9 has come on the market. This filter bank module 7 mounts or forms the RxSAW filter 3 and the impedance matching circuit collectively on the module substrate or inside the module substrate, and the output impedance of the module is matched with the input impedance of the transceiver IC 4 so as to directly connect with the transceiver IC 4.

[Patent Document 1] Japanese Patent Application Laid-open No. Hei 09-270619

Since an impedance matching work on a portable terminal manufacturer side becomes unnecessary due to the appearance of module shown in FIG. 9 or the like, the man-hours for development thereof can be reduced. However, since the module shown in FIG. 9 has a structure in which plural pieces of impedance matching circuits composed of a plurality of passive components and Rx SAW filters 3 are mounted on a substrate, it has problems in that it has too many parts and a large variation in overall characteristics in general. Even when the impedance matching circuit is realized with inter-layered parts formed inside an LTCC (Low temperature co-fired ceramics) substrate, not with discrete parts, the variation in characteristics of the whole module causes a problem due to variation in characteristics of the parts.

In addition to those, as shown in FIG. 8 and FIG. 9, a conventional impedance matching circuit requires a plurality parts for the impedance matching circuit per one system, which brings increase in cost. This reason will be explained in detail with reference to FIG. 10 and FIGS. 11A, 11B, and 11C.

FIG. 10 is an example of an SAW filter having an unbalanced input port and a balanced output port. In the present example, the output impedance of the SAW filter 3 is assumed to be Z saw (=R saw+j X saw). the output impedance of a filter bank module is assumed to be Zm (=Rm+j Xm), and the input impedance of an RF-IC is assumed to be Zic (=Ric+j Xic). Here, if there exists a relation of Z saw=Zic* (complex conjugation), an impedance matching circuit is not necessary, and the energy transfer loss (reflection loss) between both can be minimum, but in an ordinary combination of the SAW filter 3 and the RF-IC 4, since it is extremely rare that both are in the above-described complex conjugation relation, and Z saw≠Zic (R saw≠Ric and X saw≠−Xic) in general, it is necessary to design and configure an impedance matching circuit having complicated characteristics.

Concretely, a manner of configuration of an impedance matching circuit in the case of Z saw≠Zic (R saw≠Ric and X saw≠−Xic) will be shown in FIGS. 11A, 11B, and 11C. FIG. 11A is a case of no matching element, FIG. 11B is a case of connecting an inductor to an output port 3a in parallel as a matching element, and FIG. 11C is a case of connecting a capacitor and an inductor in series and in parallel as matching elements respectively to the output port 3a. The drawings on the left side of the respective figures are Smith charts, those in the center are transit characteristics, and those on the right side are configurations of the filter bank modules.

The centers of the Smith charts in FIGS. 11A to 11C are considered to be matching impedance of the RF-IC, and portions shown by bold solid lines are Zm (impedances in the filter bank modules). The mark ● in the drawing is an impedance in the vicinity of the center frequency of the filter when no matching is performed, and matching is performed so that the mark ● is moved closer toward the vicinity of the center of the smith chart by selecting the constant and circuit configuration of a matching part. As clearly seen from FIGS. 11A to 11C, if the following equation R SAW≠Ric and X saw≠−Xic are established, it is necessary to adjust both Rm and Xm at the same time with a matching circuit, which means that at least two or more parts are required for matching.

As described above, since the cost of parts for the SAW filter which requires a plurality of parts for a matching circuit is high, and the degree of freedom in variation of each part is high due to the increased number of the parts, the problem of variation in overall characteristics of the module is likely to occur. Moreover, having too many parts gives rise to another problem of requiring many man-hours to adjust the characteristics to achieve the most suitable output impedance of the module.

The present invention has been made under these circumstances, and an object thereof is to provide a surface acoustic wave filter module which enables to reduce the man-hours needed for characteristic adjustment and a method of manufacturing the filter module.

SUMMARY OF THE INVENTION

In order to solve the above-described problem, the real part (=R saw) of an output impedance Z saw of a SAW filter is planned to match with the real part (=R ic) of an input impedance Zic of a transceiver IC in a manner as follows concretely.

The surface acoustic wave filter module of the present invention is a surface acoustic wave filter module including a surface acoustic wave filter to distinguish received high frequency signals in a radio terminal, and an impedance matching circuit to obtain impedance matching when coupling the surface acoustic wave filter with the high frequency reception-processing device, in which the surface acoustic wave filter is structured so that the real part of the output impedance Z saw is matched with the real part of the input impedance Zic of the high frequency reception device, and the impedance matching circuit connects a matching element to an output port of the surface acoustic wave filter module only in parallel so that the output impedance Zm of the surface acoustic wave filter module and the input impedance Zic of the high frequency reception device are in a complex conjugation relation.

The surface acoustic wave filter module in another aspect of the present invention relates to a surface acoustic wave filter module provided with a plurality of systems including a surface acoustic wave filter distinguishing a received high frequency signal in a radio terminal, and an impedance matching circuit to obtain impedance matching for coupling the surface acoustic wave filter with the high frequency signal-processing device, in which the surface acoustic wave filter of respective systems has a configuration such that the real part of the output impedance Z saw is matched with the real part of the input impedance Zic of the high frequency signal-processing device, and the impedance matching circuit of the respective systems connects a matching element with an output port of the surface acoustic wave filter module only in parallel so that the output impedance Zm of the surface acoustic wave filter module and the input impedance Zic of the high frequency signal-processing device are in a complex conjugation relation.

That the surface acoustic wave filter has a configuration such that the real part of the output impedance Z saw is matched with the real part of the input impedance Zic of the high frequency signal-processing device, means not only that the real part of Z saw is consistent with the real of Zic, but also means that the case of having a value close to a degree of no practical effect on the characteristics is included, in other words, a value close to a degree applicable as a product even when a matching element (a matching element for real part adjustment) is not provided in the impedance matching circuit for the purpose of matching the real part of the output impedance of the surface acoustic wave filter module with the real part of the input impedance of the high frequency signal-processing device. Here, the "close value" is, for instance, 0.8 Ric<R saw<1.2 Ric. That is, the case where no matching element for real part adjustment is required when performing coupling a surface acoustic wave filter with a high frequency signal-processing device belongs to the technical scope of the present invention.

Adjustment of the real part of the output impedance Z saw of the above-described surface acoustic wave filter is performed by adjusting at least one of the number of the electrodes, the overlap width, the film thickness of the electrode, and the pitch and shape of the electrode, of IDT and/or reflector.

The matching element of the above-described impedance matching circuit is at least one out of the inductor element and the capacitor element, and these elements may be discrete parts or may be configured with a print pattern.

A method of manufacturing a surface acoustic wave module of the present invention is that of manufacturing the surface acoustic wave filter module including a surface acoustic wave filter to distinguish received high frequency signals in a radio terminal, and an impedance matching circuit to obtain impedance matching when coupling the surface acoustic wave filter with the high frequency signal-processing device, the method includes the steps of:

obtaining data for the real part and the imaginary part of the input impedance Zic of the above-described high frequency signal-processing device;

forming the surface acoustic wave filter by matching the real part of the output impedance Z saw of the above-described surface acoustic wave filter with the real part of the above-described data; and connecting matching elements to the output ports of the surface acoustic wave filter module only in parallel so that the output impedance Zm of the above-described surface acoustic wave filter module and the input impedance Zic of the above-described high frequency signal-processing device are in a complex conjugation relation.

As described above, the present invention has the following effects.

(1) It can reduce the number of parts required for impedance matching of the SAW filter module and the man-hours for impedance adjustment, which leads to a reduction of part costs and a reduction in the variation of overall characteristics.

(2) Even in the case of a combined structure of an SAW filter and an LTCC substrate or a printed circuit board, since the number of inner layer components for composing the impedance matching element can be reduced, it is possible to realize a module having fewer layers of substrate, smaller variation in the overall characteristics, and even lower cost.

(3) For formation of the SAW filter module, it is possible to design and manufacture the SAW filter and the impedance matching circuit by obtaining data for the input impedance Zic of the high frequency signal-processing device so that it can easily respond to specification change or the like of the high frequency signal-processing device.

BRIEF DESCRIPTION OF THE DRAWINGS

FIGS. 11A, 11B and 11C are views showing examples of the characteristic variation according to the impedance matching element.

DETAILED DESCRIPTION OF THE PREFERRED EMBODIMENT(S)

Figure 1:
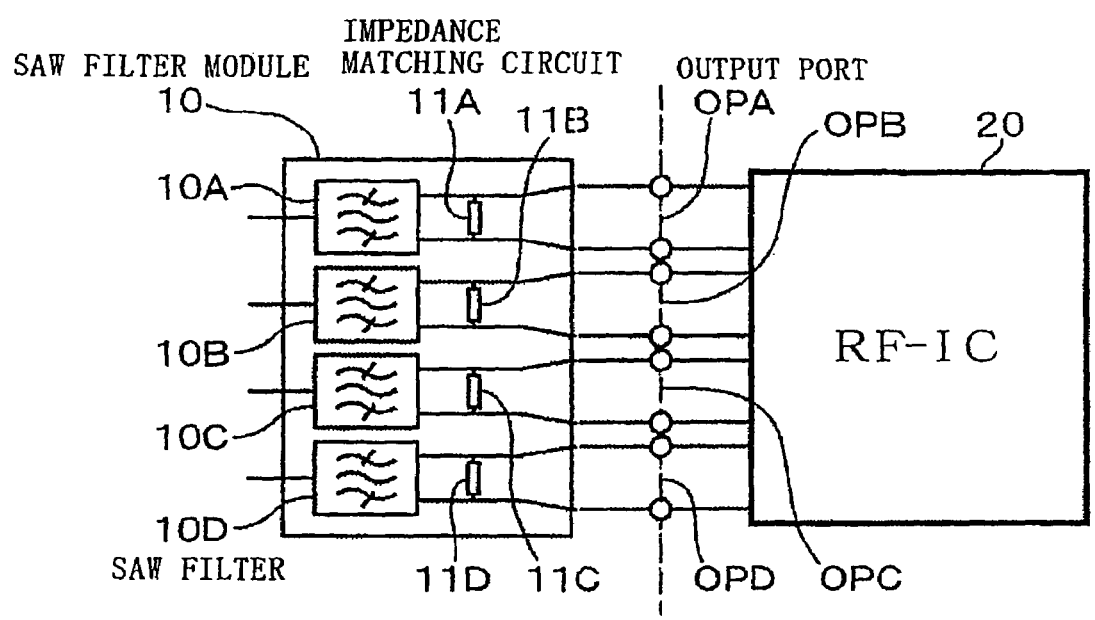
FIG. 1 is a configuration diagram of a surface acoustic wave filter module showing an embodiment of the present invention.

FIG. 1 shows a configuration in which a surface acoustic wave filter module is connected to an RF-IC showing an embodiment of the present invention.

The surface acoustic wave filter module 10 has a configuration mounting four SAW filters 10A to 10D respectively provided with one unbalanced input port and one balanced output port, and impedance matching circuits 11A to 11D are respectively mounted on the balanced output ports of these SAW filters 10A to 10D. Four output ports OPA to OPD of the modules 10 which correspond to output terminals of the impedance matching circuits 11A to 11D are respectively connected to four input ports of the RF-IC 20, which means that four systems of signal paths exist in the present example.

Here, the impedance matching circuits 11A to 11D can obtain impedance matching between the SAW filters 10A to 10D and the RF-IC 20 by providing the matching elements (inductor or capacitor) to the balanced output ports of the SAW filters 10A to 10D only in parallel. The reason why impedance matching can be obtained by such impedance matching circuits 11A to 11D will be explained in detail with reference to FIG. 2.

Figure 2:
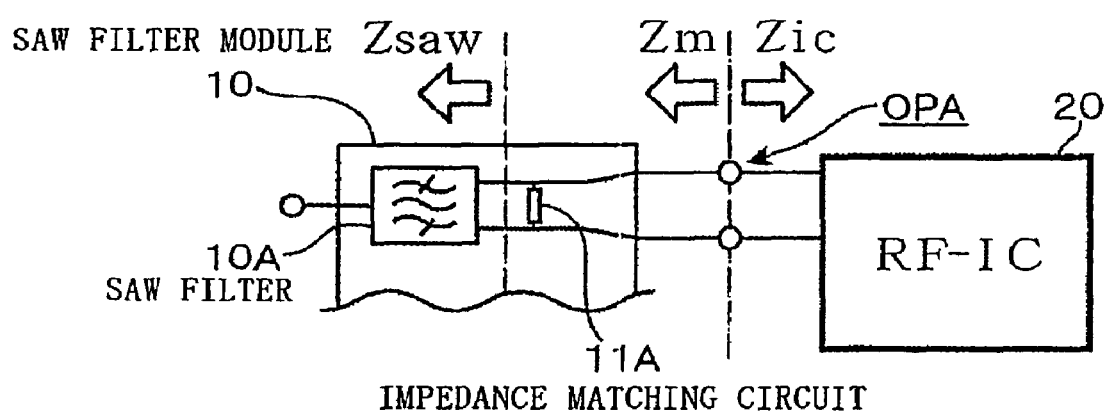
FIG. 2 is a view showing an impedance relation between the surface acoustic wave filter module and an RF-IC in the embodiment.

FIG. 2 typically shows only one SAW filter, namely, only one signal path of a system, and the output impedance of the SAW filter is defined as Z saw, the output impedance of the SAW module is defined as Zm, and the input impedance of the RF-IC is taken as Zic. Here, if the real part (=R saw) of Z saw is designed or manufactured in agreement with the real part of Zic, in other words, coincident with or nearly coincident with the real part of Zic, there is no need to practice the real part operation in the impedance matching circuit. Therefore, only the imaginary part of the output impedance Zm of the surface acoustic wave filter module is required to be modified according to the imaginary part of the input impedance Zic of the RF-IC. In other words, a structure in which one element inductor or capacitor is inserted in parallel is sufficiently acceptable as the impedance matching circuit.

Therefore, in the present embodiment, the filter module is structured such that the real part (=R saw) of the output impedance Z saw (=R saw+j X saw) of the SAW filters 10A to 10 D is nearly matched with the real part (=Ric) of the input impedance Zic (=Ric+j Xic) of the RF-IC, so as to configure the filter module by providing only one element of the impedance matching circuit 11A to 11D to the output port of the SAW filter 10A to 10D in parallel.

Figure 3:
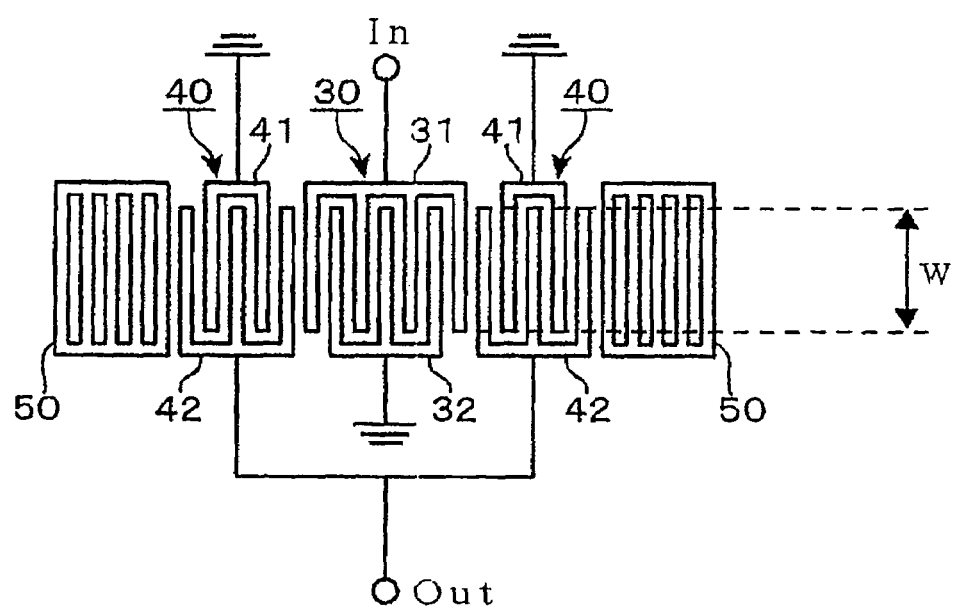
FIG. 3 is a configuration diagram showing a longitudinal mode resonator type SAW filter.

FIG. 3 is a view showing a configuration of the longitudinal mode resonator type SAW filter, and the actual structure of the respective SAW filters 10A to 10D is configured, for instance, by combination of a plurality of the longitudinal mode resonator type SAW filters. In FIG. 3, 30 designates an IDT (interdigital transducer) on the input side, which is configured by disposing comb electrodes 31 and 32 in a manner to engage with each other, and 40 designates an IDT on the output side, which is configured by disposing comb electrodes 41 and 42 in a manner to engage with each other. 50 designates a grating reflector. The adjustment of the real part R saw of the Z saw can be performed by adjusting the number of electrodes (logarithm), the overlap width W, the film thickness of the electrode, the electrode pitch, the electrode structure, of the IDTs 30 and 40, and/or the reflector 50 forming the SAW filter. Moreover, the adjustment can be realized by selecting piezoelectric materials and by combination of the adjustment such as the number of the electrodes and the selection of the piezoelectric materials.

When the real part (=R saw) of Z saw is matched with the real part of Zic, though it is most preferable if R saw=Ric, it is also acceptable even if both are not fully matched. In other words, even if a matching element to adjust the real part is not provided in the impedance matching circuit, it is acceptable if both have values close to each other in a degree of not practically affecting the characteristics, that is, usable as a product, and is sufficiently effective if 0.8 Ric<R saw<1.2 Ric. This is because ± about 20% deviation of the impedance may lead to about 0.20 to 0.25 deterioration in VSWR (voltage standing wave ratio), and the increment of insertion loss of the entire module due to the deterioration is 0.1 dB or less, which does not lead to great deterioration in characteristics.

An SAW filter module maker manufactures such an SAW filter module, for instance, as follows. First, data of the real part and imaginary part of the input impedance Zic of the RF-IC are obtained from an RF-IC manufacturer, the number of the IDT electrodes or the like is adjusted so that the real part of the output impedance Z saw of the SAW filter is matched with the real part of the above-described input impedance Zic based on the above-described data as described above. In order to match the imaginary part of the output impedance Zm of the SAW filter module with the imaginary part of the input impedance Zic of the RF-IC (since Zm and Zic are in a complex conjugation relation, the plus and minus signs of both imaginary parts are opposite), the matching element is connected to the output port of the SAW filter module only in parallel, and thus the SAW filter module is manufactured.

Figure 4:
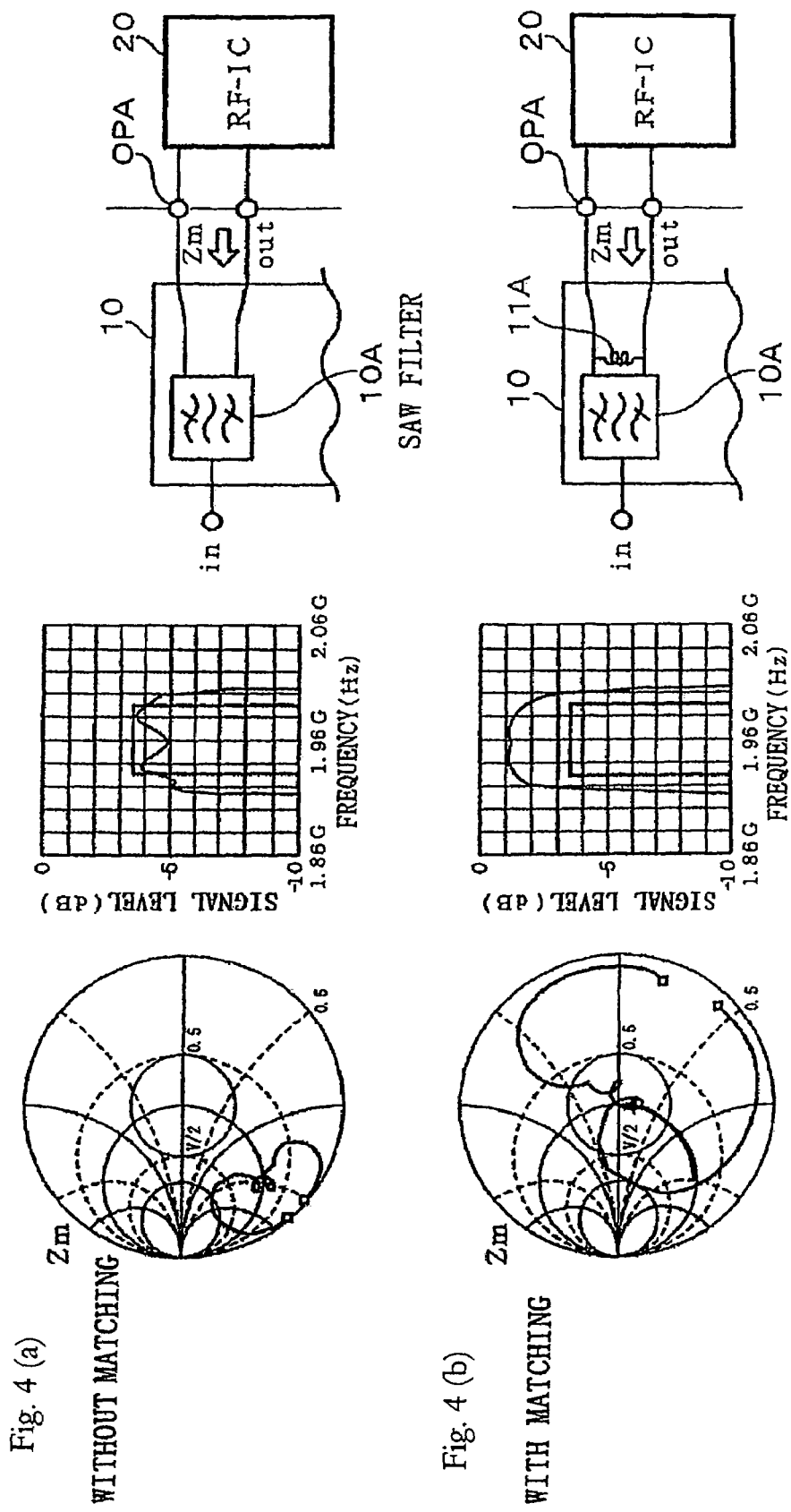
FIGS. 4A and 4B are views showing an experimental result of impedance matching based on the embodiment.

FIGS. 4A and 4B show an experimental result of the impedance matching based on the present embodiment. FIG. 4A shows the characteristics in the case of not providing an impedance matching circuit, and FIG. 4B shows the characteristics in the case of providing an impedance matching circuit by disposing an inductor in the SAW filter in parallel. The drawings on the left side of the respective figures are Smith charts, those in the center are transit characteristics, and those on the right side are configurations of the filter bank modules. In the Smith charts, the mark ● is impedance in the vicinity of the center frequency of the filter when no matching is performed, and as can be understood from the bold line showing Zm, Zm approaches the matching impedance of RF-IC 20 from the mark ●. Since impedance operation for both the real part and the imaginary part are required in the conventional method in FIGS. 11A, 11B and 11C, a plurality pieces are necessary (inductor and capacitor in the case of FIGS. 11A, 11B and 11C) for impedance matching. However, since R saw=Ric in the case according to the present embodiment, a desired impedance matching can be obtained by providing an inductor in parallel as an impedance matching circuit.

As described above, by applying the present embodiment, the number of parts required for impedance matching of the SAW module and the man-hours for impedance adjustment can be reduced, which leads to a reduction of part costs and a reduction in the variation of overall characteristics.

Moreover, when the SAW filter according to the present embodiment is mounted on an LTCC substrate, since the number of parts formed inside the LTCC can be reduced, it is possible to realize a module having fewer layers of substrate, smaller variation of the overall characteristics, and even lower cost.

Moreover, it is possible to obtain the same operation and effect by suitably changing the design according to modification of the SAW filter and the impedance matching circuit in the present embodiment.

Figure 5:
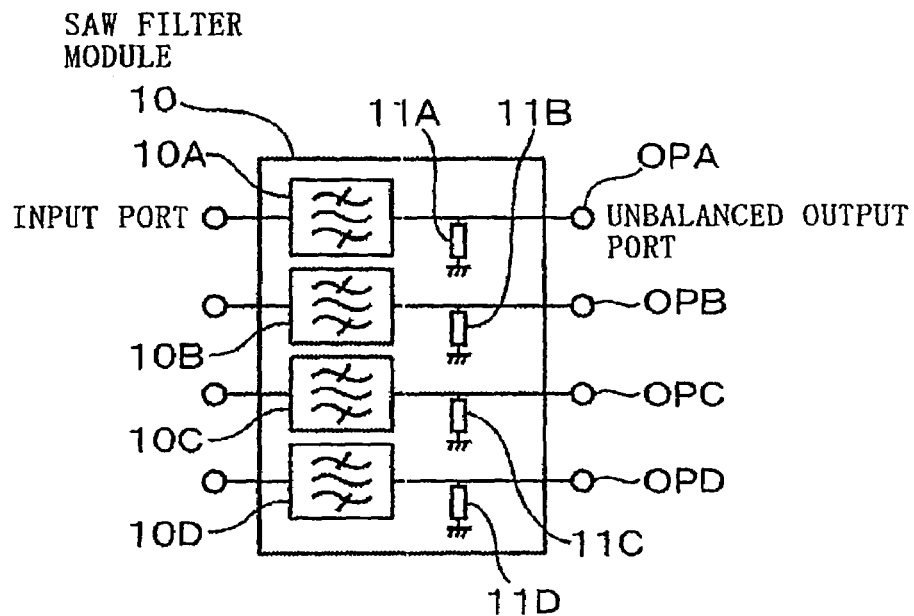
FIG. 5 is a view showing an embodiment of an SAW filter of which output port is unbalanced.

For instance, FIG. 5 is an example of an SAW filter of which output port OP is unbalanced, in which impedance matching circuits 11A to 11D each having one element are provided between the output ports OPA to OPD of the SAW filter 10A to 10D and the reference potential, and it does not matter in the present invention whether the type of the port is balanced or unbalanced.

Figure 6:
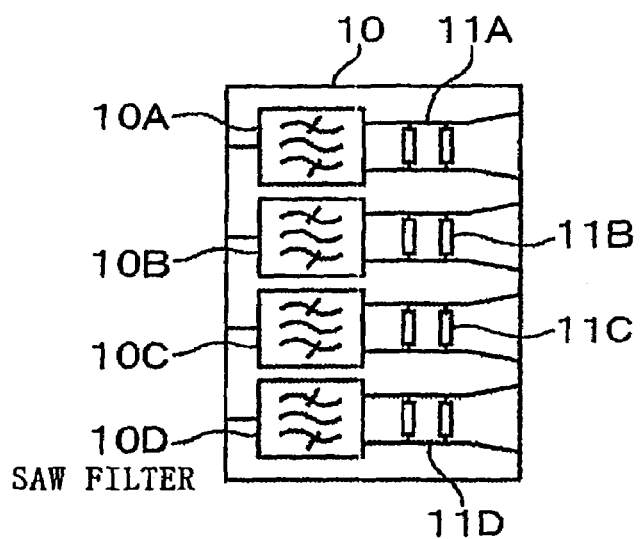
FIG. 6 is a view showing an embodiment in which the impedance matching elements are arranged in parallel.

FIG. 6 is the case of providing two elements in parallel as an impedance matching circuit. In order to reduce an insertion loss of the overall module, when Q value of a matching part is low, that is, when the resistance value contained in the equivalent circuit of the inductor for instance is high, it is possible to lower the effective resistant component by diverting the electric current by making two elements in parallel.

Figure 7:
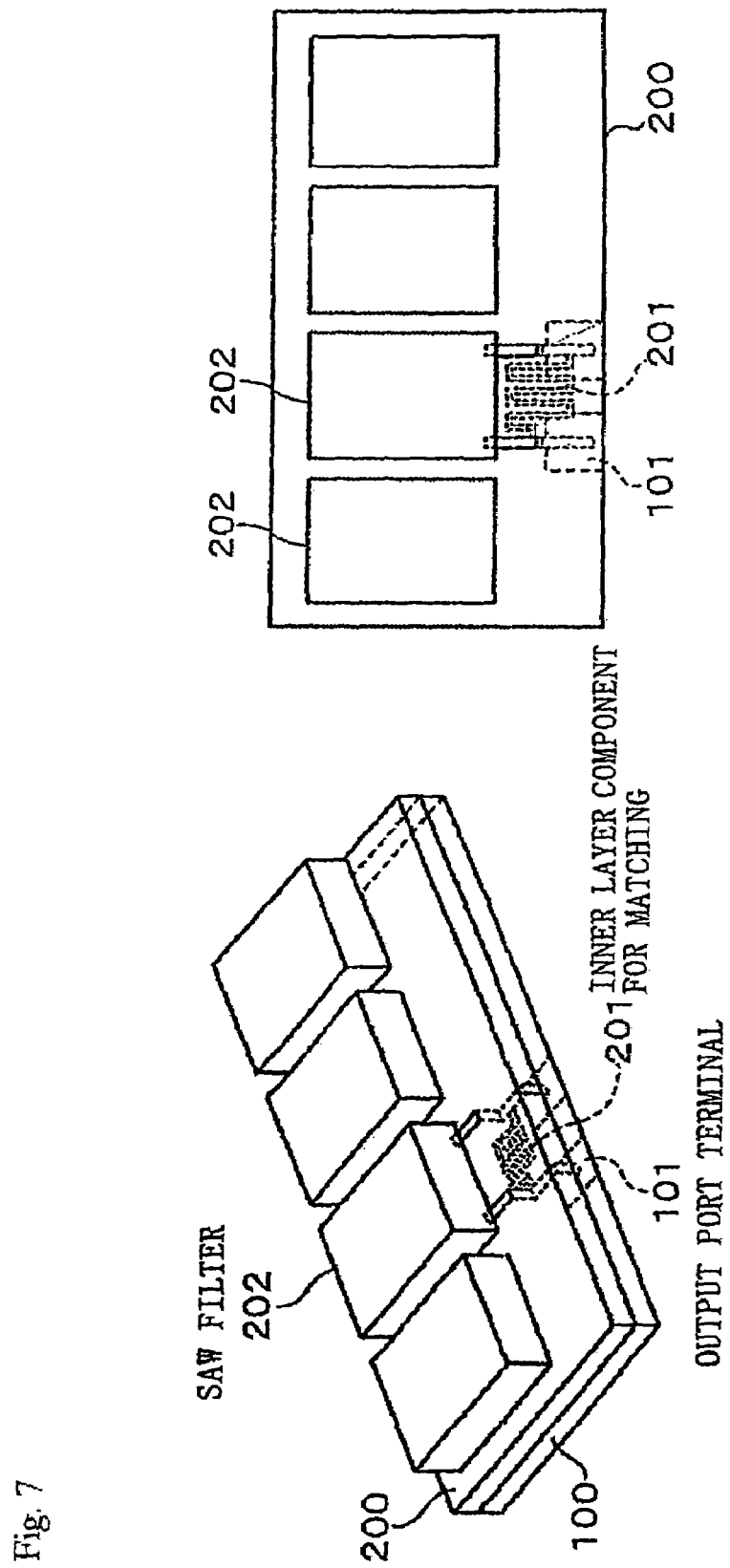
FIG. 7 is a view showing an embodiment in which impedance matching parts are arranged in an inner layer inside a substrate.
Figure 8:
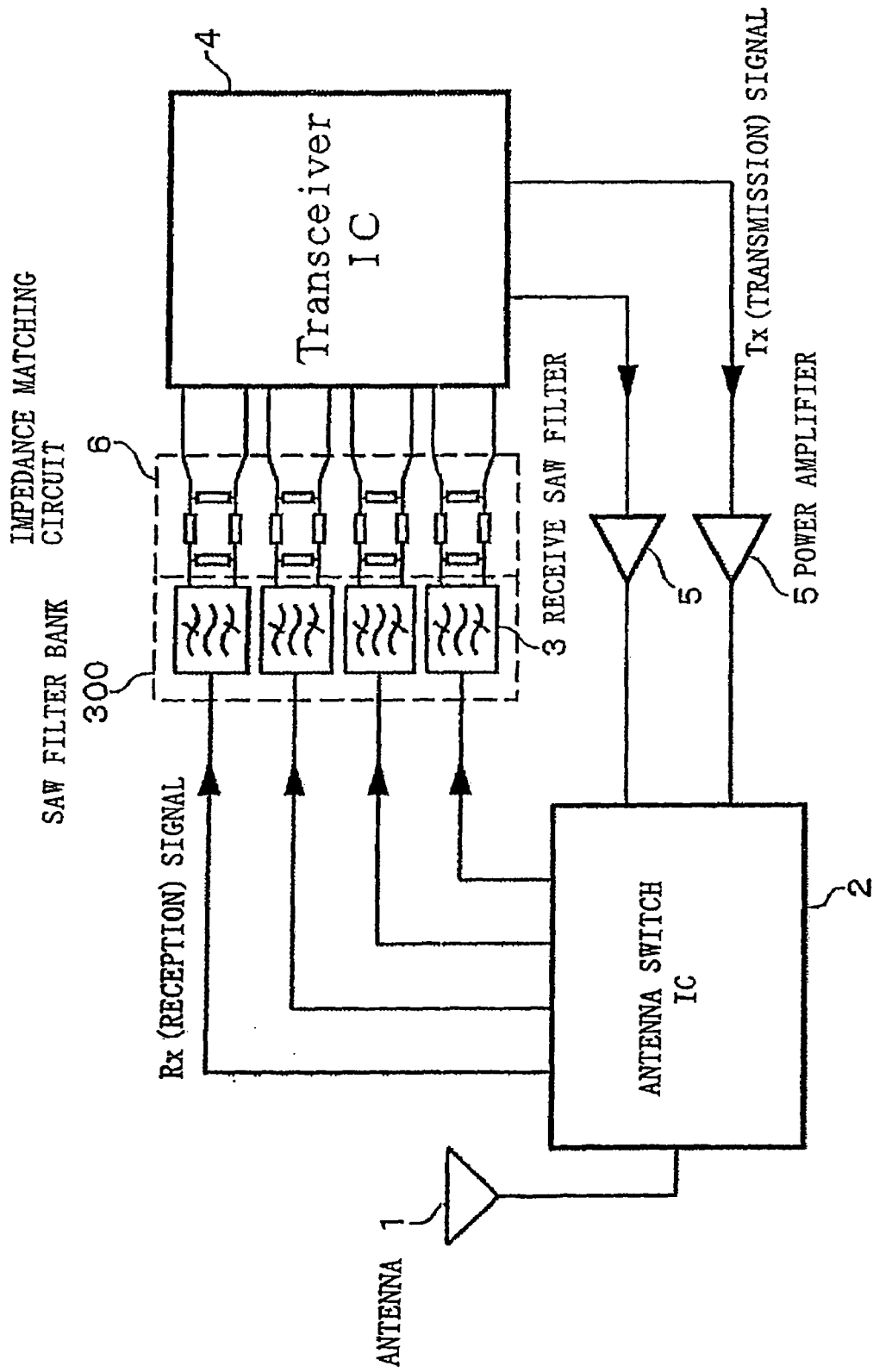
FIG. 8 is a configuration example of a front-end portion of a quad band GSM type cellular phone (conventional example)
Figure 9:
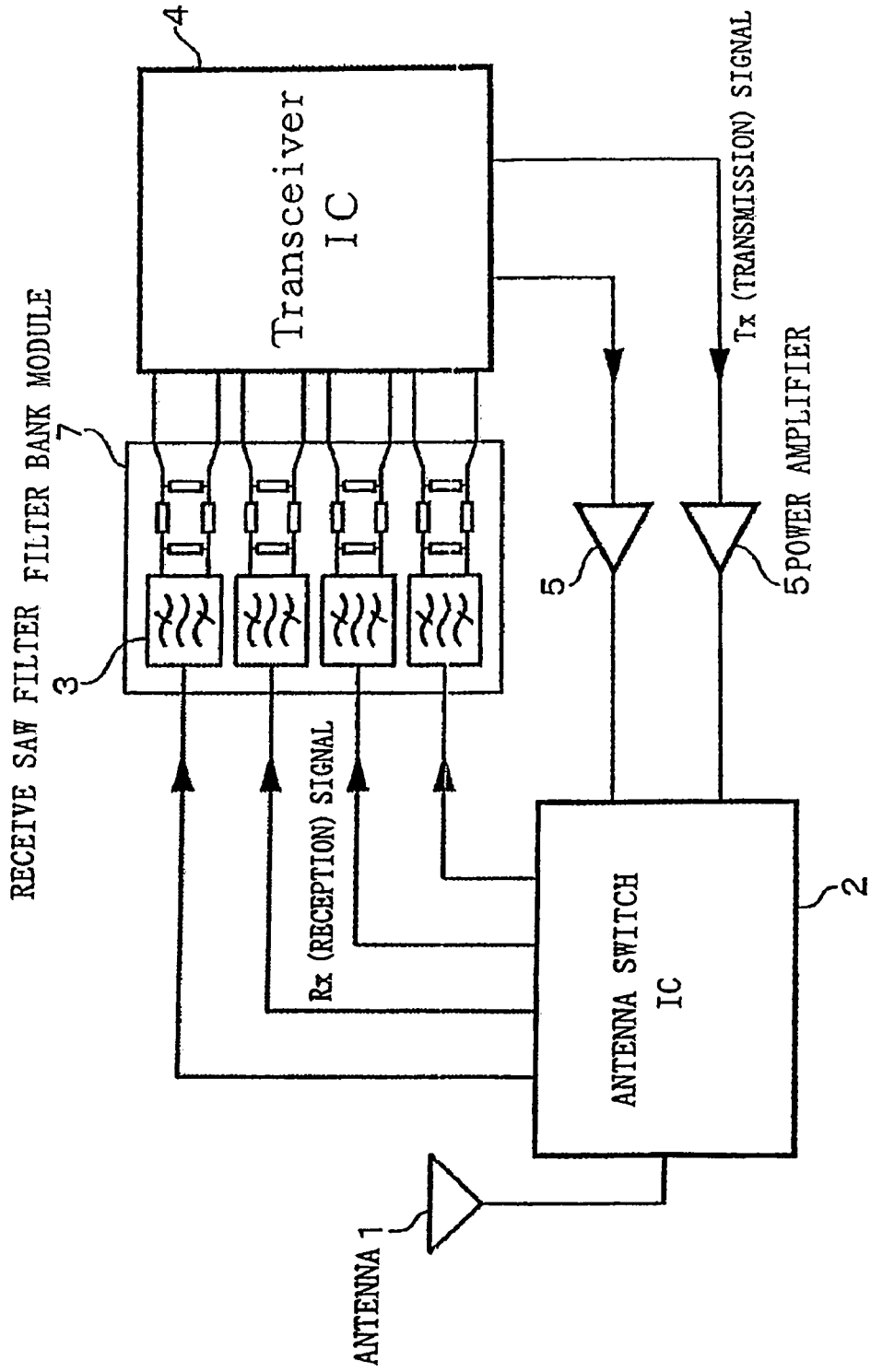
FIG. 9 is a configuration example of a filter bank module of a quad band GSM type cellular phone (conventional example)
Figure 10:
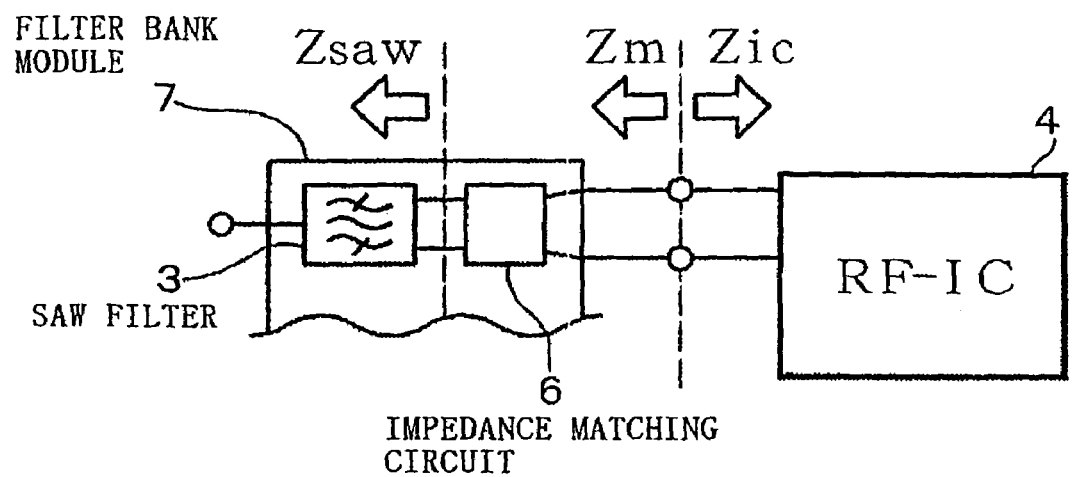
FIG. 10 is a view showing the impedance relation between the surface acoustic wave filter module and the RF-IC.

FIG. 7 is an example case when an impedance matching part is embedded in a substrate such as an LTCC or a printed board. In the drawing, an output port terminal 101 to connect with RF-IC is formed on the back surface of a substrate 100 being the first layer (on the first layer from the bottom), and at the same time, an inner layer component 201 which is a component of an impedance matching circuit, for instance, an inductor is formed as a print pattern on the back surface of a substrate 200 being the second layer, and the output port terminal 101 and the inner layer component 201 are electrically connected via a plating layer serving as a conductive layer of the through hole of the substrate 100 being the first layer. An SAW filter module is formed such that, for instance, four SAW filters 202 are mounted on the front surface of the substrate 200 being the second layer, and the output ports of the respective SAW filter 202 and the inner layer component 201 are connected with each other via a plating layer serving as a conductive layer of the through holes formed on the substrate 200. Note that only one system of the output port terminal 101 and the inner layer component 201 is shown in FIG. 7.

As described above, though the present invention is characterized by a structure in which an additional part used for an impedance matching circuit is inserted into the output port of an SAW filter only in parallel, as for the form of the part, it does not matter which kind of the above-described individual part (discrete part) is used or imbedded in a substrate.

The present invention can be applied to any circuit formation of SAW filter and any kind of module substrate. As a piezoelectric substrate of the SAW filter, a wafer for the SAW device having a piezoelectric function such as LiTaO3, LiNbO3, and quartz crystal can be used.

What is claimed is:

1. A high frequency radio device, comprising:
a high frequency reception processing device having receiver input ports presenting a balanced input having a receiver input impedance including a receiver input real impedance;
a surface acoustic wave filter module, comprising:
a substrate having a pair of output port terminals;
a surface acoustic wave filter provided on the substrate and having a filter characteristic for distinguishing received high frequency signals, and including a pair of balanced output ports presenting a balanced filter output having a filter output port impedance including a filter output port real impedance;
a pair of signal paths disposed on said substrate and connected respectively to the pair of balanced output ports of the surface acoustic wave filter and the pair of output port terminals of the substrate; and
an impedance matching circuit provided on the substrate configured to effect impedance matching between the balanced output of the surface acoustic wave filter with the receiver input port of the high frequency reception processing device;
the pair of output port terminals connected to each of the pair of signal paths and also connected to the receiver input ports;
said surface acoustic wave filter being structured so that the filter output port real impedance is substantially matched with the receiver input real impedance of said high frequency reception processing device, wherein said surface acoustic wave filter includes an interdigital transducer and a reflector, and adjustment of the filter output port real impedance of is performed by adjusting at least one of the interdigital transducer or the reflector by setting at least one of a number of electrodes of the interdigital transducer, an overlap width, a film thickness of the electrodes, or a pitch and shape of the electrodes; and
said impedance matching circuit being provided only between the signal paths of the pair of signal paths on the substrate, the impedance matching circuit having at least one matching element connected to and between the signal paths of the pair of signal paths on the substrate and selected such that the filter output port impedance of said surface acoustic wave filter module and the receiver input impedance of the high frequency reception processing device are in a complex conjugation relationship.

2. The high frequency radio receiver configuration according to claim 1, wherein the receiver input real impedance is Ric, and the filter output port real impedance of said surface acoustic wave filter is R saw and satisfies the relationship 0.8 Ric<R saw<1.2 Ric.

3. The high frequency radio receiver configuration according to claim 2, wherein the matching element of said impedance matching circuit is at least one selected from a group of an inductor element and a capacitor element.

4. The high frequency radio receiver configuration according to claim 3, wherein the matching element of said impedance matching circuit consists of only one element selected from the group of an inductor element and a capacitor element.

* * * * *